United States Patent
Kabasawa et al.

(10) Patent No.: US 8,264,618 B2
(45) Date of Patent: Sep. 11, 2012

(54) REMOTE CONTROL APPARATUS

(75) Inventors: Kenichi Kabasawa, Saitama (JP);
Takashi Tsurumoto, Saitama (JP);
Masatoshi Ueno, Kanagawa (JP);
Akihiro Kikuchi, Chiba (JP)

(73) Assignee: Sony Corporation, Tokyo (JP)

( * ) Notice: Subject to any disclaimer, the term of this patent is extended or adjusted under 35 U.S.C. 154(b) by 737 days.

(21) Appl. No.: 12/329,824

(22) Filed: Dec. 8, 2008

(65) Prior Publication Data

US 2009/0147151 A1    Jun. 11, 2009

(30) Foreign Application Priority Data

Dec. 7, 2007  (JP) ................................. 2007-317353

(51) Int. Cl.
| | |
|---|---|
| H04N 5/44 | (2011.01) |
| H04N 5/445 | (2011.01) |
| G06F 3/00 | (2006.01) |
| G06F 13/00 | (2006.01) |
| G06Q 10/00 | (2012.01) |
| H01L 23/10 | (2006.01) |
| H01L 23/34 | (2006.01) |
| G08B 13/14 | (2006.01) |

(52) U.S. Cl. ............. 348/734; 725/42; 725/60; 705/1.1; 257/707; 340/572.5

(58) Field of Classification Search ........................ None
See application file for complete search history.

(56) References Cited

U.S. PATENT DOCUMENTS

| | | | |
|---|---|---|---|
| 6,424,947 B1 * | 7/2002 | Tsuria et al. ................... 705/1.1 |
| 6,543,052 B1 * | 4/2003 | Ogasawara ..................... 725/60 |
| 2002/0036720 A1 * | 3/2002 | Umeda ......................... 348/734 |
| 2002/0171631 A1 | 11/2002 | Yanagi |
| 2003/0006901 A1 * | 1/2003 | Kim et al. .................. 340/572.5 |
| 2005/0166231 A1 * | 7/2005 | Terakado et al. ............... 725/42 |
| 2007/0052088 A1 * | 3/2007 | Tsurume et al. .............. 257/707 |
| 2010/0091198 A1 * | 4/2010 | Matsuo ......................... 348/734 |

FOREIGN PATENT DOCUMENTS

| | | |
|---|---|---|
| JP | 01-142292 | 9/1989 |
| JP | 09-162818 | 6/1997 |
| JP | 10-107531 | 4/1998 |
| JP | 3118790 | 10/2000 |
| JP | 2001-067412 | 3/2001 |
| JP | 2001-126000 | 5/2001 |
| JP | 2002-109441 | 4/2002 |

(Continued)

OTHER PUBLICATIONS

Japanese Office Action (JP 2007-317353) dated Nov. 27, 2009.

(Continued)

*Primary Examiner* — Jefferey Harold
*Assistant Examiner* — Sean Haiem
(74) *Attorney, Agent, or Firm* — K&L Gates LLP

(57) ABSTRACT

A remote control apparatus for remotely operating an electronic device. The remote control apparatus including: an operation section having a plurality of operation keys; and a reader/writer configured to read and/or write information from or to an information storage medium, wherein in said operation section, at least one of the plurality of operation keys is arranged so as to overlap a read/write portion of said reader/writer, the read/write portion being used for the reading and/or writing of the information from or to the information storage medium.

7 Claims, 8 Drawing Sheets

FOREIGN PATENT DOCUMENTS

| | | |
|---|---|---|
| JP | 2004-164547 | 6/2004 |
| JP | 2004-287592 | 10/2004 |
| JP | 2005-063368 | 3/2005 |
| JP | 2001-022904 | 1/2007 |
| WO | 0207260 | 1/2002 |
| WO | 2007013294 | 2/2007 |

OTHER PUBLICATIONS

European Search Report dated Aug. 25, 2010 for corresponding European Application No. 08021093.3.

* cited by examiner

REMOTE CONTROL APPARATUS

CROSS REFERENCES TO RELATED APPLICATIONS

The present application claims priority to Japanese Patent Application JP 2007-317353, filed in the Japan Patent Office on Dec. 7, 2007, the entire contents of which is being incorporated herein by reference.

BACKGROUND

The present application relates to a remote control apparatus for operating an electronic device.

There have been proposed television receivers that are capable of connecting to the Internet. For example, in a known technique, a television video signal upon which is superimposed a signal including uniform resource locator (URL) information about a network service related to a television broadcast program is transmitted, and then a television receiver receives this signal, accesses an access point corresponding to the URL via the Internet to receive data, and displays a corresponding website on a cathode ray tube (CRT) (see Japanese Patent Laid-Open No. Hei 9-162818).

In another known technique, a television receiver that is capable of connecting to the Internet performs a variety of data processing on the Internet while using information stored in an information storage medium, such as an integrated circuit (IC) card, (see Japanese Patent Laid-Open No. 2001-67412).

In such a television receiver that is capable of connecting to the Internet, an IC card is placed close to a reader/writer that is contained in the television receiver or externally connected to the television receiver, and information that is read from or written to the IC card is transmitted and received via the Internet. In the case where a user downloads a content, such as a movie content or a game content, from the Internet to enjoy it, for example, the IC card in which information is stored is placed close to the reader/writer, and this information is transmitted to the Internet via the television receiver, so that a price of the content is paid. Meanwhile, when the user performs an ordinary operation related to the television receiver, such as volume control or channel change, the user enters an operation instruction into a remote control apparatus (i.e., a remote controller) at a distance from the television receiver, and this operation instruction is transmitted to the television receiver.

SUMMARY

In the above case, while the ordinary operation instruction related to the television receiver is entered into the remote controller, the user needs to carry the IC card to the vicinity of the television receiver when applying the IC card to the television receiver, such as when purchasing the content. This is not convenient for the user.

The present application addresses the above-identified and other problems associated with methods and apparatuses in related art, and provides a remote control apparatus which realize more comfortable user operation in processes that involve the application of an information storage medium, such as an IC card, to an electronic device that can be operated using a remote control apparatus.

According to one embodiment of the present application, there is provided a remote control apparatus for remotely operating an electronic device, the remote control apparatus including: operation means having a plurality of operation keys; and a reader/writer configured to read and/or write information from or to an information storage medium. At least one of the plurality of operation keys is arranged so as to overlap a read/write portion of the reader/writer, and is covered by the information storage medium at the time of communication with the information storage medium, the read/write portion being used for the reading and/or writing of the information from or to the information storage medium.

According to an embodiment, a user is able to perform an operation for a process that involves use of an information storage medium, such as paying a price in Internet communication, at a distance from an electronic device, such as a television receiver, using a remote control apparatus at hand. Thus, comfortable user operation is achieved.

According to an embodiment, at least one of the plurality of operation keys on the remote control apparatus is arranged so as to overlap the read/write portion for the information storage medium. Thus, an efficient use of a surface of the remote control apparatus is achieved, and operation of the remote control apparatus is made easier.

Additional features and advantages are described herein, and will be apparent from the following Detailed Description and the figures.

DETAILED DESCRIPTION

Hereinafter, an embodiment of the present application will be described in detail with reference to the accompanying drawings.

Figure 1:
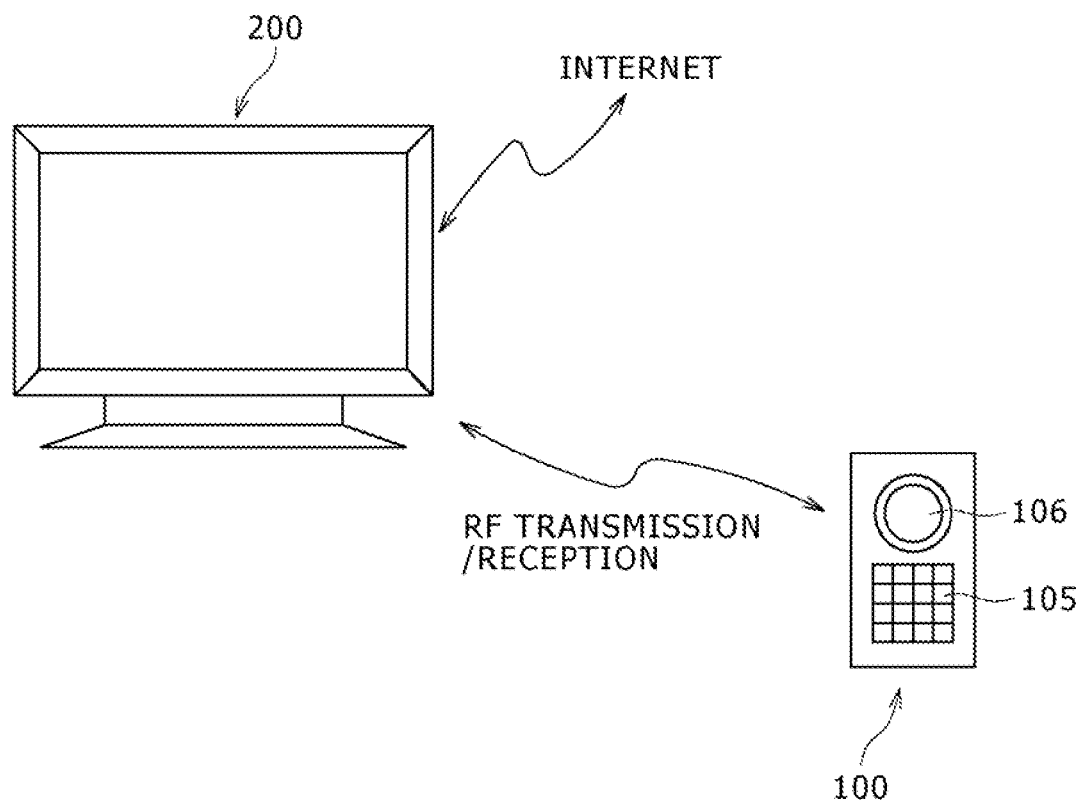
FIG. 1 shows the structure of a communication system to which a remote control apparatus according to one embodiment of the present application.

FIG. 1 shows the structure of a communication system 1 according to one embodiment of the present application. The communication system 1 includes a remote control apparatus (i.e., a remote controller; hereinafter referred to as a "remote control") 100, and a television receiver 200. The television receiver 200 is an exemplary electronic device that performs wireless communication with the remote control 100.

The remote control 100 includes a key operation section and a reader/writer. The key operation section has arranged thereon operation keys to be used for entering operation signals based on user operations aimed at the television receiver 200. The reader/writer is used to read and write information from or to an IC card (not shown). In addition to ordinary functions as a common television broadcast receiver, the television receiver 200 has a capability to connect to the Internet.

Thus, the television receiver 200 is capable of downloading a content provided by an Internet service provider via the Internet, and playing the content. Examples of such contents include a movie content, an animation content, a drama content, a sport content, and a game content.

To the communication system 1 can be applied a short-range wireless communication system that has a maximum data transfer rate of 250 kbps, a maximum transmission distance of 30 m, and a low power consumption, and which allows multiple devices to be connected to a single network, for example. This short-range wireless communication system is commonly applied to remote control for a home appliance and so on, and uses IEEE (Institute of Electrical and Electronic Engineers) 802.15.4 for a physical layer interface. In Japan, the 2.4 GHz carrier band, as used in IEEE 802.11b for a wireless local area network (LAN), is divided into 16 channels for use. In the United States and Europe, the 915 MHz band and the 868 MHz band, respectively, can be used.

The remote control 100 and the television receiver 200 transmit and receive a signal therebetween via bidirectional short-range wireless communication using a radio frequency (RF) signal with a carrier frequency of 2.4 GHz according to the IEEE 802.15.4 communication system.

The IC card contains a rewritable semiconductor memory, such as an EEPROM (Erasable Programmable Read Only Memory), and an IC chip on which a central processing unit (CPU) and so on are mounted. Thus, the IC card is capable of complicated data processing. The remote control 100 according to the present embodiment reads and writes the information from or to the IC card. The IC card is a contactless IC card, which does not need to be brought into contact with the reader/writer of the remote control 100, when the information is read from or written to the IC card. The signal is transmitted and received between the IC card and the remote control 100 using a radio wave emitted from the reader/writer.

Examples of the information which the remote control 100 reads and writes from or to the IC card include: electronic money used in a charging process when purchasing the content; and an identification number and a password for accessing the electronic device.

Figure 2:
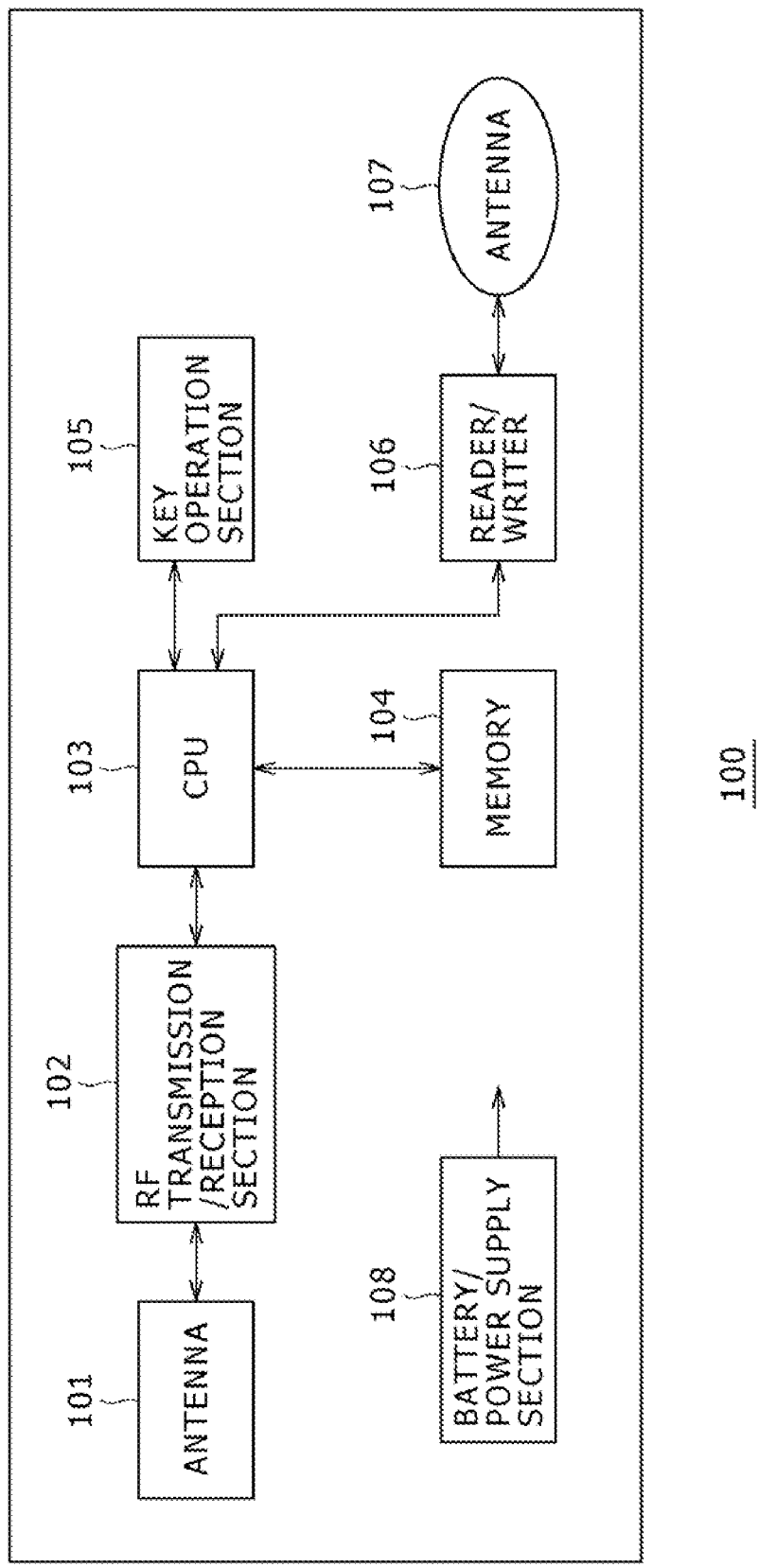
FIG. 2 shows the structure of the remote control apparatus according to an embodiment.

FIG. 2 is a block diagram illustrating the structure of the remote control 100. The remote control 100 includes: an antenna 101 used for the wireless communication between the television receiver 200 and the remote control 100; an RF transmission/reception section 102 for transmitting and receiving the RF signal via the antenna 101; a CPU 103; a memory 104 connected to the CPU 103; a key operation section 105; a reader/writer 106 for reading and writing the information from or to the IC card; an antenna 107 for causing electromagnetic interaction between the IC card and the reader/writer 106; and a battery/power supply section 108 for supplying power to each part of the remote control 100.

The reader/writer 106 uses radio frequency identification (RFID) to read and write the information from or to the IC card. Specifically, if a current is applied to the antenna 107, an alternating magnetic field is generated in the antenna 107, and then, if the IC card is placed close to a card information read portion of the reader/writer 106 as located within the magnetic field, an alternating voltage is induced in an antenna coil in the IC card. This alternating voltage is converted into a direct-current voltage within the IC card, so that the IC chip starts operating. Also, if a current is applied to an antenna of the IC card, a magnetic field is generated and affects the antenna 107. The reader/writer 106 performs amplitude-shift keying (ASK), frequency-shift keying (FSK), phase-shift keying (PSK), or the like on a carrier wave exchanged between the reader/writer 106 and the IC card to communicate with the IC card. The reader/writer 106 uses electromagnetic induction at 13.56 MHz in the RFID as described above to achieve magnetic flux coupling between the antenna 107 and the antenna of the IC card, thereby transmitting and receiving the signal to or from the IC card.

The key operation section 105 has arranged thereon operation keys used for entering operation instructions based on user operations aimed at the television receiver 200. The operation keys include a channel selection key, a volume key, an Enter key, and so on. Some of these operation keys are also used for a process that involves use of the information stored in the IC card.

The memory 104 includes a random access memory (RAM), a read only memory (ROM), and so on.

The CPU 103 reads a program stored in the ROM in the memory 104 and loads the program into the RAM in the memory 104, and thus controls entire signal processing in the remote control 100.

The RF transmission/reception section 102 transmits and receives the signal to or from the television receiver 200 via the antenna 101, via the short-range wireless communication using the RF signal with a carrier frequency of 2.4 GHz according to the IEEE 802.15.4 communication system.

Under control of the CPU 103, the RF transmission/reception section 102 unidirectionally transmits, to the television receiver 200 via the short-range wireless communication, an ordinary operation instruction aimed at the television receiver 200, such as an instruction for volume control or an instruction for channel change, and bidirectionally transmits and receives, to or from the television receiver 200 via the short-range wireless communication, the information read from or written to the IC card.

The battery/power supply section 108 includes a battery for driving the remote control 100, and a power supply for supplying a current for the reader/writer 106 to read and write the information from or to the IC card.

The RF signal is omnidirectional. Therefore, via the short-range wireless communication, the remote control 100 is capable of communicating with the television receiver 200 even when an obstacle is present in its vicinity, and is also capable of transmitting and receiving data to be written to or read from the IC card at a high speed, even if the amount of the data is large.

Figure 3:
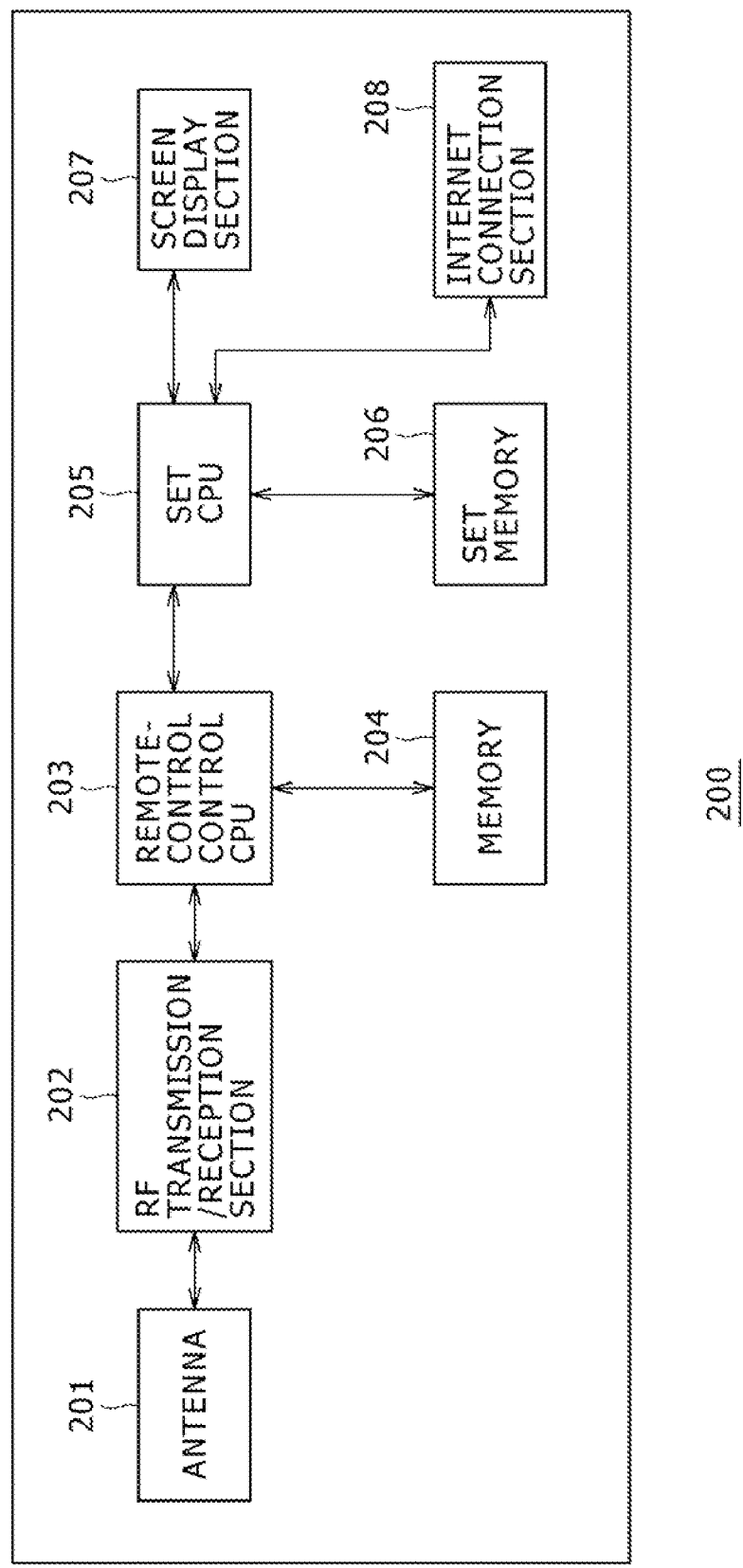
FIG. 3 shows the structure of a television receiver that can be remotely operated using the remote control apparatus according to an embodiment.

FIG. 3 shows the structure of the television receiver 200. The television receiver 200 includes: an antenna 201 for performing the wireless communication with the remote control 100; an RF transmission/reception section 202 for transmitting and receiving the RF signal via the antenna 201; a remote-control control CPU 203 for controlling the remote control 100; a memory 204 connected to the remote-control control CPU 203; a set CPU 205; a set memory 206 connected to the set CPU 205; a screen display section 207; and an Internet connection section 208 connected to the Internet via a communication channel.

The RF transmission/reception section 202 transmits and receives the signal to or from the remote control 100 via the antenna 201, via the short-range wireless communication using the RF signal with a carrier frequency of 2.4 GHz according to the IEEE 802.15.4 communication system.

In the case of a liquid crystal display (LCD), for example, the screen display section 207 includes a liquid crystal panel, a backlight, and so on. The screen display section 207 displays a television program, a content or the like acquired from the Internet, a selection screen for remote control operation, or the like.

The Internet connection section 208 is connected to the Internet via the communication channel, such as a broadband communication channel. Under control of the set CPU 205, the Internet connection section 208 is capable of downloading the content from a server. Examples of the content include the movie content, the sport content, the drama content, and the game content. Note that the Internet connection section 208 may be independent of the television receiver 200, and placed at the rear of the television receiver 200 and connected to the television receiver 200 via an HDMI (High Definition Multimedia Interface) cable or the like.

The set memory 206 includes a RAM, a ROM, and so on.

The set CPU 205 reads a program stored in the ROM in the set memory 206 and loads the program into the RAM in the set memory 206, and thus controls entire signal processing in the television receiver 200. Specifically, the set CPU 205 performs data processing on the Internet via the Internet connection section 208, or controls image processing on an image to be displayed by the screen display section 207, for example. In addition, the set CPU 205 acquires, from the server via the Internet connection section 208, information that is subjected to data processing on the Internet, and transmits and receives this information to or from the remote-control control CPU 203.

The memory 204 includes a RAM, a ROM, and so on.

The remote-control control CPU 203 reads a program stored in the ROM in the memory 204 and loads the program into the RAM in the memory 204, and thus controls the RF transmission/reception section 202 to transmit or receive the signal to or from the remote control 100.

The remote-control control CPU 203 acquires, from the set CPU 205, the information acquired from the server, passes this information to the remote control 100 via the above-described short-range wireless communication, and reads and writes the information from or to the IC card via the CPU 103 in the remote control 100. In other words, the reading and writing of the information from or to the IC card as performed by the reader/writer 106 in the remote control 100 are controlled by instructions received by the television receiver 200.

Note that the television receiver 200 may further include an additional memory such as a large-capacity, rewritable hard disc drive (HDD). A user-desired video content can be stored in this memory.

Next, an operation of the communication between the remote control 100 and the television receiver 200 in the communication system 1 will now be described below.

If the user operates any of the operation keys arranged in the key operation section 105 of the remote control 100, the CPU 103 determines that an operation instruction has been entered, and transmits a corresponding instruction to the television receiver 200 via the RF transmission/reception section 102 and the antenna 101.

In the television receiver 200, the remote-control control CPU 203 identifies the instruction acquired via the antenna 201 and the RF transmission/reception section 202, and performs a controlling process corresponding to this instruction.

In the case where the user desires to purchase the content, such as the movie content, the animation content, the drama content, the sport content, or the game content, from the Internet, the user performs a necessary operation on the remote control 100 while viewing an operation screen displayed by the television receiver 200, to select and determine the content which the user desires to purchase. In the case where the user uses the IC card to determine how to pay for the content and pay a price of the content, the remote-control control CPU 203 in the television receiver 200 transmits, to the remote control 100 via the RF transmission/reception section 202 and the antenna 201 via the short-range wireless communication, information indicating that the communication should be started with the IC card. The CPU 103 in the remote control 100 turns on power of the reader/writer 106, and causes the antenna 107 to emit an electromagnetic wave necessary for the reading and writing of the information from or to the IC card, thereby reading the information stored in the IC card. The information read from the IC card is transmitted to the television receiver 200 via the RF transmission/reception section 102 and the antenna 101.

The television receiver 200 transmits the information read from the IC card to a corresponding server via the Internet. The set CPU 205 in the television receiver 200 receives a response from the server. The remote-control control CPU 203 receives this information from the set CPU 205, passes the information acquired by the set CPU 205 from the server to the remote control 100 via the RF transmission/reception section 202 via the above-described short-range wireless communication, and carries out the reading and writing of the information from or to the IC card via the CPU 103 in the remote control 100.

Similar procedures are repeated several times to complete the process of paying the price using the IC card. If there is no further need for the reading or writing of the information from or to the IC card, the remote-control control CPU 203 in the television receiver 200 is notified of that fact by the CPU 103 in the remote control 100, and the power of the reader/writer 106 is turned off.

Meanwhile, in the case where the user performs an ordinary operation aimed at the television receiver 200, such as an operation for the volume control or the channel change, the CPU 103 in the remote control 100 simply performs a process of transmitting an operation instruction corresponding to the user operation on the key operation section 105 to the television receiver 200 via the RF transmission/reception section 102 and the antenna 101.

At this time, the remote-control control CPU 203 in the television receiver 200 simply performs a controlling process corresponding to the operation instruction received from the remote control 100, without the need to transmit a response signal to the remote control 100.

Thus, the power of the reader/writer 106 in the remote control 100 is kept off at the time of such an ordinary operation.

As described above, in the communication system 1, the remote control 100 is equipped with the reader/writer that uses the RFID communication system to read and write the information from or to the IC card. Thus, the user is able to perform, at a distance from the television receiver 200, an operation in a process that involves the use of the IC card and which is carried out on the Internet, such as the charging process.

Further, in the communication system 1, the same communication system is applied to both the communication from the remote control 100 to the television receiver 200 at the time of the ordinary operation and the transmission and reception of the information related to the IC card. Thus, it is possible to accomplish device miniaturization and prevent an increase in the number of parts and an accompanying increase in cost, without preparing a plurality of communication channels using different communication systems.

Still further, in the communication system 1, the power of the reader/writer 106 is kept off at the time of any ordinary key operation such as when transmitting the operation instruction, and the power of the reader/writer 106 is turned on only when the reading and writing of the information from or to the IC card is necessary. This contributes to reducing a power consumption of the battery.

In the present embodiment, the communication system 1 has the television receiver 200 as an electronic device. Note, however, that a communication system according to another embodiment may have any electronic device that receives the operation instruction from the remote control.

Next, details of the arrangement or the like of parts of the remote control 100 as described above will now be described below.

Figure 4:
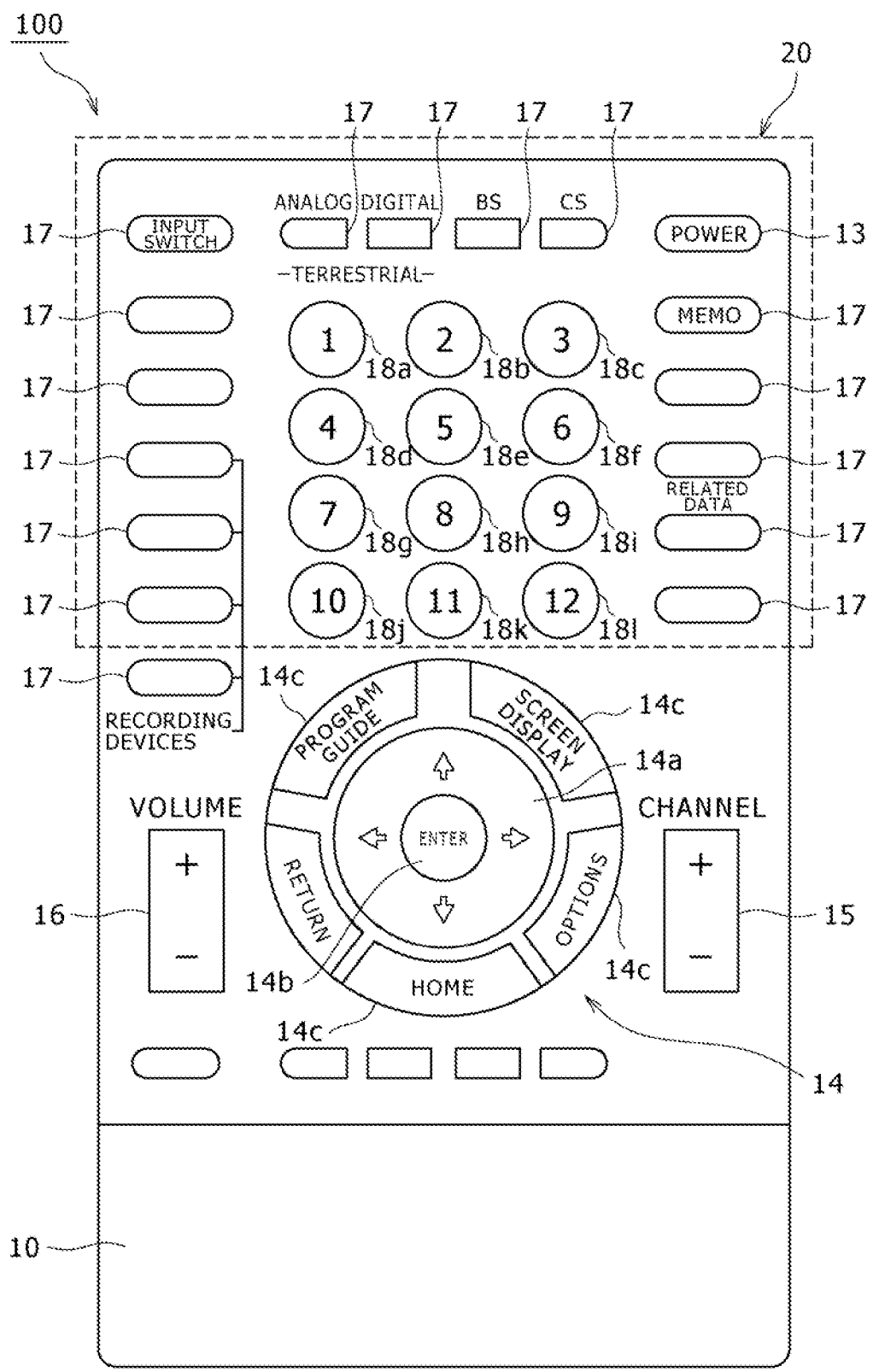
FIG. 4 shows a front view of the remote control apparatus according to an embodiment.
Figure 5:
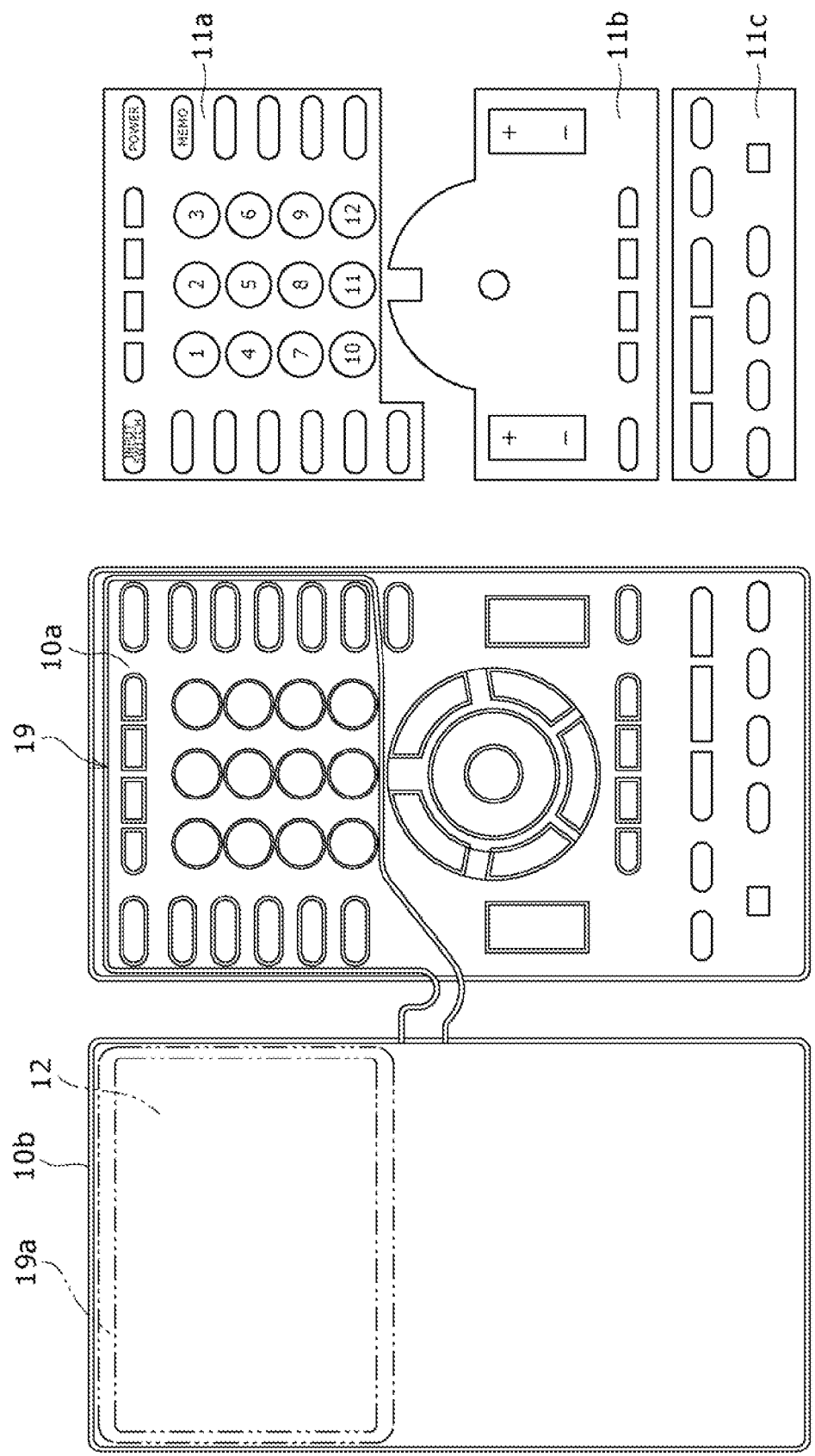
FIG. 5 schematically illustrates the inside of the remote control apparatus according to an embodiment.

FIG. 4 is an exemplary front view of the remote control 100 according to the present embodiment. FIG. 5 schematically illustrates the inside of the remote control 100.

As illustrated in FIGS. 4 and 5, the remote control 100 includes: a box-shaped case 10 composed of a front cover 10a and a rear cover 10b; operation key portions 11a to 11c, which form the key operation section 105 and are formed of a rubber material or the like; and a printed wiring board (PWD) 12, which is placed within the case 10 and attached to the rear cover 10b.

The case 10 is composed of the front cover 10a and the rear cover 10b. The front cover 10a has holes through which protruded parts of the operation key portions 11a to 11c, which are to be operated by the user, pass. The rear cover 10b has a fixing portion (not shown) in its interior, and holds the printed wiring board 12 so as to be fixed on the fixing portion. Moreover, the rear cover 10b has a battery holding portion (not shown) for holding a dry battery used for the power supply. The battery holding portion is covered by a rear lid, which forms a part of a rear face of the case 10. At the time of replacing the dry battery, a hook portion of the rear lid as engaged with the rear face of the case 10 is brought out of engagement with the rear face of the case 10, so that the rear lid can be lifted.

As illustrated in FIG. 4, in the operation key portions 11a to 11c are arranged: a power key 13 for controlling the on/off of power of the television receiver 200; selection keys 14 composed of a directional key 14a, an Enter key 14b, and various display selection keys 14c; an Up/Down channel key 15 used for up/down channel selection; a volume control key 16 used for the volume control; various function keys 17; and number keys 18a to 18l. The directional key 14a is shaped like a ring and marked with "←," "↑," "→," and "↓" signs to be operated to move a cursor displayed on a display screen based on a guide displayed on the screen display section 207 in the television receiver 200. The Enter key 14b is circular and placed in the middle of the selection keys 14. The various display selection keys 14c are used to display a screen such as a program guide. The number keys 18a to 18l are placed substantially in the middle of the remote control 100, and assigned numbers "1" to "12," respectively, used for the channel selection.

The selection keys 14a to 14c are used, for example, when the user selects and determines the content, such as the movie content, the animation content, the drama content, the sport content, or the game content, which he or she desires to download from the server on the Internet, based on the guide displayed on the display screen of the television receiver 200. Specifically, suppose that a content selection screen showing a list of purchasable contents is delivered via the Internet to the television receiver 200 and displayed on the display screen of the television receiver 200. Then, the user operates the directional key 14a placed in a central part of the remote control 100 to move the cursor to a desired content as displayed on the screen, and presses the Enter key 14b while the cursor is on the desired content, thereby determining the content which the user desires to download. Then, if a screen for a purchasing procedure appears, the user proceeds to an online procedure for purchasing the desired content. At this time, if the user desires to switch the content, for example, the user can press one of the selection keys 14c marked with "Return" to return to the content selection screen. As described above, the selection keys 14 as shown in FIG. 4 need to be operated at the time of selecting a service offered via the Internet or at the time of the procedure for purchasing the content, for example.

Note that use of the selection keys 14a to 14c is not limited to the time when a service is provided via the Internet. It is to be appreciated that the selection keys 14a to 14c may also be used for ordinary television operation related to the television receiver.

Each of the Up/Down channel key 15 and the volume control key 16 is an operation key marked with "+" and "−" signs. By pressing a "+" key in the Up/Down channel key 15, the user is able to increase the number of the channel selected. By pressing a "+" key in the volume control key 16, the user is able to raise the volume. By pressing a "−" key in the Up/Down channel key 15, the user is able to decrease the number of the channel selected. By pressing a "−" key in the volume control key 16, the user is able to lower the volume. Note that when the remote control 100 reads and writes the information from or to the IC card, the Up/Down channel key 15 and the volume control key 16 can be used as operation keys necessary for the process of reading and writing the information. Details thereof will be described later.

The number keys 18a to 18l are operation keys used for direct channel selection. The numbers marked on the number keys 18a to 18l indicate corresponding channel numbers. The user is able to switch the channel of the television broadcast to be received by the television receiver 200, by pressing one of the number keys 18a to 18l that corresponds to a desired channel number. In the remote control 100 according to the present embodiment, a portion where the number keys 18a to 18l are arranged overlaps a card read/write portion 20 for the IC card, and the antenna 107 of the reader/writer 106 is arranged on the same face of the printed wiring board on which these operation keys are arranged. Details thereof will be described later.

The various function keys 17 include, for example: a screen switch key for switching to a service provider selection screen for receiving a VOD (Video On Demand) service; an input switch key; broadcast switch keys for selecting an analog broadcast or a digital broadcast; a recording key; a recording schedule key; and so on. Note, however, that the various function keys 17 are not limited to the aforementioned keys, and that the aforementioned keys are not essential to the present application.

The protruded parts of the operation key portions 11a to 11c, which include the aforementioned various operation keys, are made of resin or the like such that the protruded parts can be pressed. The operation key portions 11a to 11c are fixed on the front cover 10a, which has the holes through which the operation keys can pass, so as to form the key operation section 105 of the remote control 100 according to the present embodiment. Note that functions of the various operation keys are not limited to those described above, and that the above-described functions are not essential to the present application. Also note that the types of the operation keys and the arrangement of the keys on a front face of the remote control are not limited to those described above, and that a variety of other operation keys may be arranged on remote controls according to other embodiments.

In the present embodiment, the state of the remote control 100 that faces FIG. 4, showing the front view of the remote control 100, will be referred to as a "front direction" of the remote control 100. Note that, when the user operates the remote control 100, it is not necessary that the user cause the front direction to face the television receiver 200. As noted previously, the RF signal is used in the communication between the remote control 100 and the television receiver 200. Therefore, even if the remote control 100 faces in an opposite direction relative to the front direction, the remote control 100 is able to perform the wireless communication with the television receiver 200.

The printed wiring board 12 is fixed on the rear cover 10b, which forms part of the case 10. The printed wiring board 12 includes: the antenna 101 for communicating with the television receiver 200; the RF transmission/reception section 102 for transmitting and receiving the RF signal; the CPU 103 for controlling the remote control 100; the memory 104; a circuit board of the reader/writer 106 for reading and writing the information from or to the IC card; and the antenna 107 for generating and supplying the voltage for allowing the IC chip in the IC card to operate, so as to communicate with the IC card.

Figure 6:
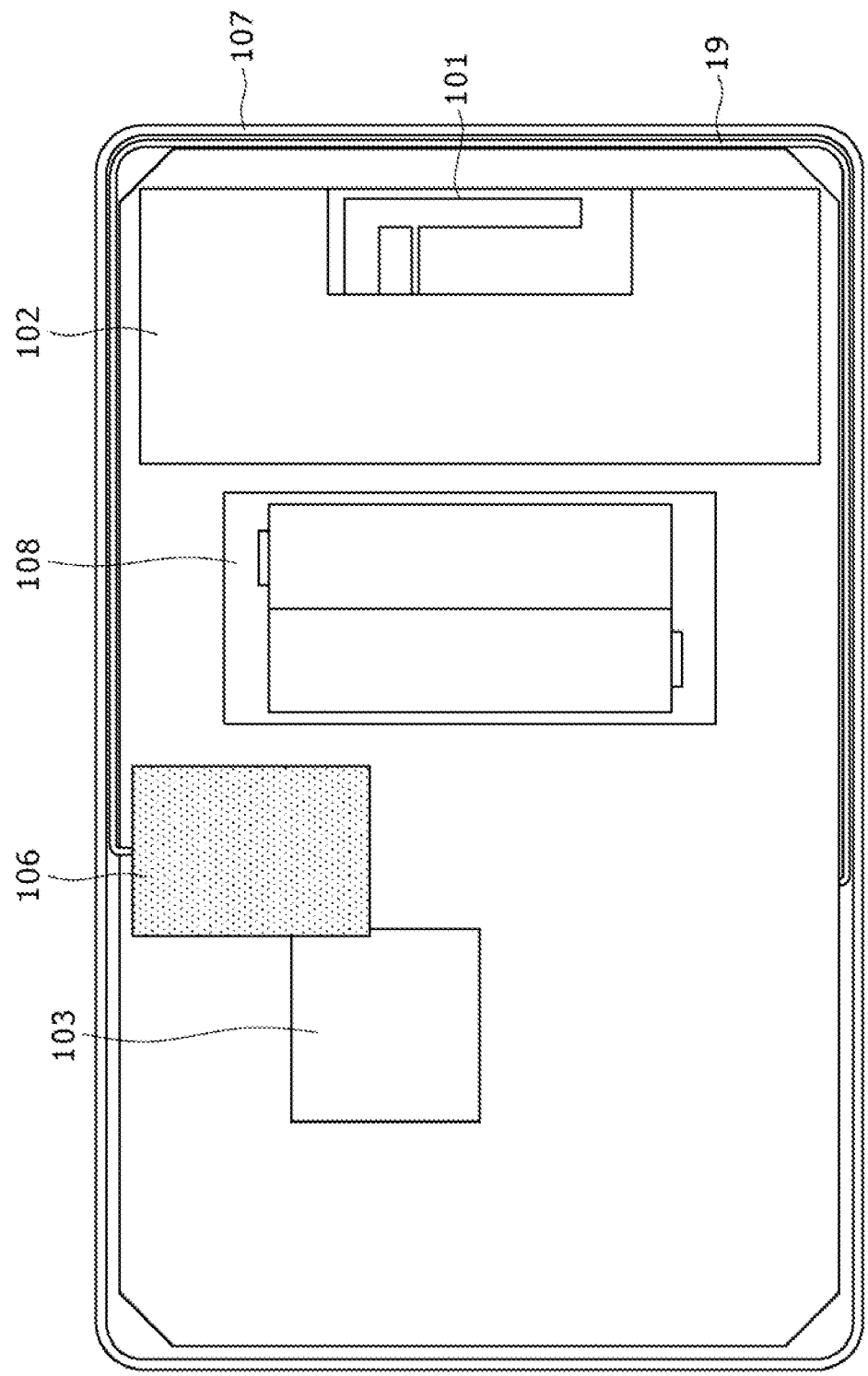
FIG. 6 schematically illustrates the arrangement of components on a printed wiring board (PWD) in the remote control apparatus according to an embodiment.

FIG. 6 schematically illustrates an exemplary arrangement of components on the printed wiring board 12 in the remote control 100 according to the present embodiment. As shown in FIG. 6, the RF transmission/reception section 102 and the antenna 101, which are used to communicate with the television receiver 200, are arranged in a top part (in the front direction) of the remote control 100. The circuit board of the reader/writer 106, which controls the reading and writing of the information from or to the IC card, is arranged as a separate board in a substantially central part of the remote control 100. The CPU 103, which controls the remote control 100, is arranged to the rear of the circuit board of the reader/writer 106. In addition, in the remote control 100, a loop antenna 19 formed by a loop-shaped lead is arranged, as the antenna 107 for the reader/writer 106, so as to surround that part of the printed wiring board on which the number keys 18a to 18l for the direct channel selection are arranged. Further, in the remote control 100, the battery, which serves as the power supply, is arranged inside and not in contact with the loop antenna 19, which corresponds to the antenna 107 for the reader/writer 106. Note that the above arrangement of the components on the printed wiring board 12 is not essential to the present application. Other arrangements are possible in other embodiments.

The loop antenna 19 generates the alternating magnetic field for supplying power to an electronic information storage medium, such as the IC card, or writing and reading the information to or from the electronic information storage medium. The loop antenna 19 is connected to the circuit board of the reader/writer 106 formed on the printed wiring board 12, and functions as the antenna 107 for the reader/writer 106. The signal received by the loop antenna 19 is passed to the CPU of the reader/writer 106. Meanwhile, a current signal generated under control of the CPU of the reader/writer 106 is applied to the loop antenna 19 to read or write the information from or to the IC card.

As noted previously, in the remote control 100, the number keys 18a to 18l and the various function keys 17 are arranged inside the loop antenna 19, which is arranged so as to extend along edges of the printed wiring board 12 to surround the printed wiring board 12 (see FIGS. 5 and 6). Thus, a portion where the loop antenna 19 is arranged forms the card read/write portion 20 for reading and writing the information from or to the IC card. By placing the IC card close to the card read/write portion 20 where the magnetic field has been generated by the loop antenna 19, the user is able to allow the reader/writer 106 to read and write the information from or to the IC card. This portion is also a portion where the number keys 18a to 18l and the like are operated.

As described above, in the remote control 100, the loop antenna 19 is formed by placing the lead so as to extend along the edges of the printed wiring board 12. This enables the operation keys to be arranged inside the loop antenna 19, and also enables the operation keys to be arranged on the same face on which the card read/write portion 20 is arranged.

In the embodiment as described above, the loop antenna is formed by placing the lead so as to extend along the edges of the printed wiring board 12. Note, however, that a loop antenna 19a may be formed by forming a pattern of copper leaf or the like so as to extend along a chain double-dashed line as shown in FIG. 5. This loop antenna 19a achieves the same effects as those of the above-described loop antenna 19, which is formed of the lead. In order to maintain the performance of the antenna, it is desirable that the loop antenna 19 or 19a, which is formed of the lead or the pattern, be arranged so as to be as distant as possible from any other patterns or electronic components.

Figure 7:
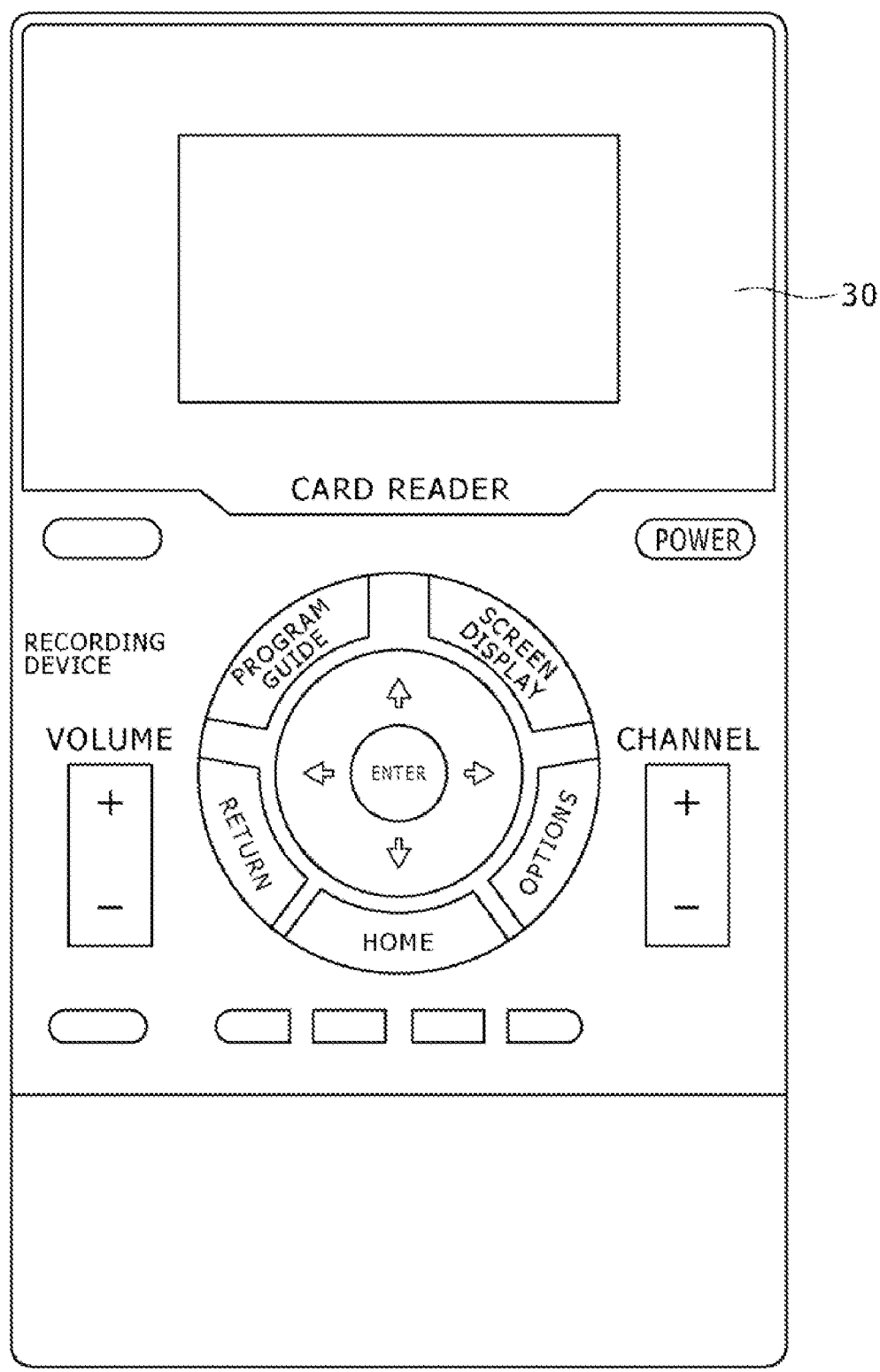
FIG. 7 shows a front view of a remote control apparatus that does not have number keys.

As described above, in the remote control 100, the loop antenna 19 is arranged in the above-described manner, and the operation keys are arranged so as to overlap the card read/write portion 20 when viewed from above in the front direction of the remote control 100. Thus, an efficient use of a surface of the body is achieved. Thus, the remote control 100 allows the user to perform remote control operations more easily, as compared to when the user uses a remote control as shown in FIG. 7, which is provided with a card read/write portion 30 but not number keys, for example.

Further, the remote control 100 has a smaller body than a remote control in which a card read/write portion and number keys are arranged at different locations. Thus, the remote control 100 is convenient. Moreover, in the remote control 100, the loop antenna and the operation keys are arranged on the same printed wiring board, which contributes to reducing the size of the printed wiring board and a production cost of the printed wiring board.

Still further, in the remote control 100, the loop antenna 19 is formed of the lead or the pattern and extends along the edges of the printed wiring board 12 so as to surround the printed wiring board 12 as described above to enable the reading and writing of the information from or to the IC card. Thus, as shown in FIG. 6, the battery that forms the battery/power supply section 108 can be arranged inside the loop antenna 19 without significantly interfering with the electromagnetic waves generated by the antenna, as long as the battery is not in contact with the loop antenna 19. This eliminates the need to provide separate space for placing the battery, resulting in a reduction in the size of the remote control. Note that, in this case, it is preferable that the battery arranged inside the antenna 107, which extends along the edges of the printed wiring board 12 so as to surround the printed wiring board 12, be placed in a position as far from the antenna as possible, i.e., in a central position.

Note that it is not essential to the present application that the battery that forms the battery/power supply section 108 be placed in the above-described position, i.e., inside the loop antenna 19. In another embodiment, the battery may be placed outside of and far from the loop antenna 19.

Still further, in the remote control 100 according to the present embodiment, the loop antenna 19 is arranged so as to extend along the edges of the printed wiring board 12 to surround the printed wiring board 12. Therefore, the magnetic field is not disturbed by any metal part arranged on the printed wiring board. Thus, the coverage of the magnetic field generated from the loop antenna 19 extends to the rear side of the remote control 100 (i.e., the side of the rear cover 10*b*). Accordingly, the reading and writing of the information from or to the IC card is possible not only from the front side of the remote control 100 (i.e., the side where the operation keys are arranged) but also from the rear side of the remote control 100. Thus, the user can place the rear side of the card read/write portion 20 of the remote control 100 over the IC card placed on a nonmetallic table to carry out the charging process, electronic settlement, or the like, for example. Note that, in this case, electronic components made of a metal or the like that would disturb the magnetic field generated from the antenna should not be placed below the loop antenna 19 (i.e., rearward relative to the loop antenna 19).

Figure 8A:
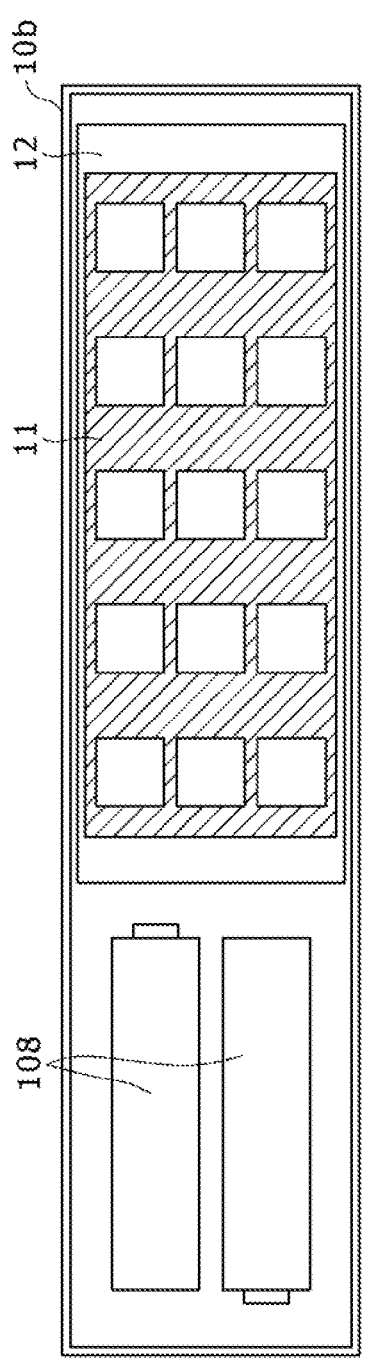
FIGS. 8A, 8B, and 8C schematically illustrate the internal structure of a remote control apparatus according to another embodiment, and show a front view, a cross-sectional view, and a rear view, respectively, of this remote control apparatus.
Figure 8B:
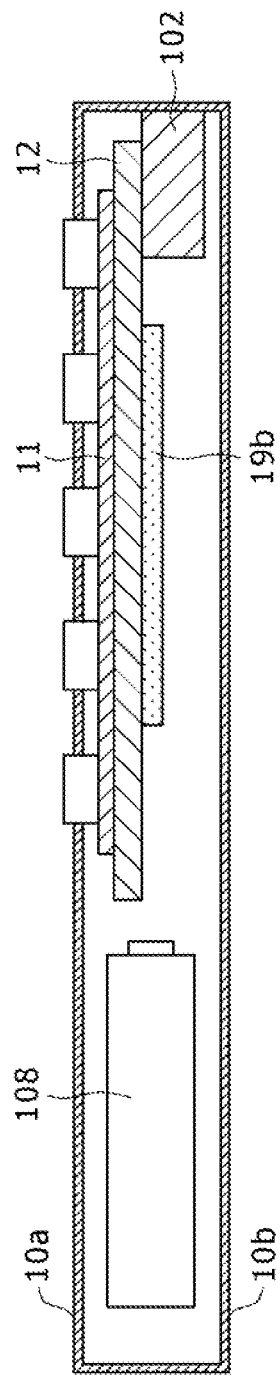
Figure 8C:
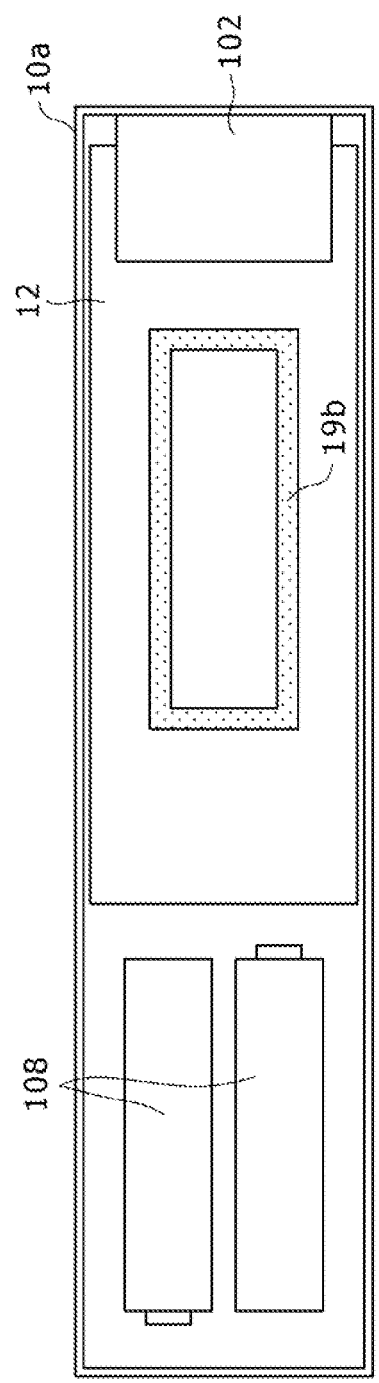

Note that a loop antenna 19*b* as illustrated in FIGS. 8A, 8B, and 8C may be formed in another embodiment. FIGS. 8A to 8C schematically illustrate the internal structure of the remote control 100 according to this embodiment. FIG. 8A is a front view of the remote control 100 with the front cover 10*a* removed. FIG. 8B is a schematic cross-sectional view of the remote control 100. FIG. 8C is a rear view of the remote control 100 with the rear cover 10*b* removed. Specifically, the remote control 100 according to this embodiment contains a double-sided printed wiring board, and the operation keys are arranged on a front side of the printed wiring board while the loop antenna 19*b* is arranged on a rear side of the printed wiring board by pattern formation. The loop antenna 19*b* forms the card read/write portion 20. At least one of the operation keys is arranged so as to overlap the card read/write portion 20 when viewed from above in the front direction of the remote control 100. In this case, the card read/write portion 20 is formed on the rear side of the remote control 100 (i.e., the side of the rear cover 10*b*). Accordingly, the user will cause the reader/writer 106 to carry out the reading and writing of the information from or to the IC card, by placing the card read/write portion 20 on the rear side of the remote control 100 over the IC card.

In addition, depending on the materials, arrangement, wiring, or the like of the components on the printed wiring board 12, it may be possible to carry out the reading and writing of the information from or to the IC card, even by placing the IC card over the front side of the remote control 100.

As described above, the case 10 of the remote control 100 contains the double-sided printed wiring board that has the front side on which the operation keys are arranged and the rear side on which the loop antenna 19*b* is arranged by the pattern formation, and at least one of the operation keys overlaps the card read/write portion 20. Thus, efficient use of the surface of the remote control 100 is achieved, and a sufficient number of operation keys and the card read/write portion 20 can be arranged on the remote control 100, without the need to decrease the number of operation keys. In addition, when carrying out the reading and writing of the information from or to the IC card, the user places the card read/write portion 20 on the rear side of the remote control 100 over the IC card. At this time, no operation keys arranged on the front side of the remote control 100 will be covered by the IC card. This will facilitate the user operation at the time of the card read/write. Note that the loop antenna may be formed on a separate printed wiring board, independent of the printed wiring board on which the operation keys are arranged, such that the two printed wiring boards are placed one on top of the other. Also note that it is not essential to the present application that the loop antenna be formed by the pattern formation. It may be so arranged that the loop antenna is formed of the lead, and that the lead is arranged on the rear side of the printed wiring board whose front side has the operation keys arranged thereon.

Note that, in this case, the battery that forms the battery/power supply section 108 may be placed at a location different from that of the printed wiring board and far from the loop antenna such that the battery does not overlap the printed wiring board when viewed from above in the front direction of the remote control 100. This will contribute to further reducing influence of a metallic part of the battery on the loop antenna.

Next, an operation performed by the user when reading/writing the information from or to the IC card using the remote control 100 having the reader/writer 106 will now be described specifically below, with reference to an exemplary case where the user purchases the content, such as the movie content, the animation content, the drama content, the sport content, or the game content, from the service provider on the Internet.

When purchasing the content, such as the movie content or the animation content, from the service provider on the Internet, the user performs necessary operations on the remote control 100 while viewing the list of contents or the operation screen as displayed on the television receiver 200. Specifically, the user operates the selection keys 14 (e.g., the directional key 14*a* marked with the "←," "↑," "→," and "↓" signs) to select the content to be purchased, and presses the Enter key 14*b* to determine to purchase the selected content. Then, in the case where the user has determined to use the IC card to pay for the content, and pays the purchase price, the reader/writer 106 in the remote control 100 performs the process of reading the information stored in the IC card and the process of writing the information to the IC card. At this time, the user operates the remote control 100 while placing the IC card over the card read/write portion 20 provided in the remote control 100.

As described above, the user performs the operation for purchasing the content by operating the selection keys 14 while placing the IC card over the card read/write portion 20 in the remote control 100.

The information read from the IC card is transmitted to the television receiver 200 via the RF transmission/reception section 102 and the antenna 101, and then this information is transmitted from the television receiver 200 to the server via the Internet. The CPU 203 in the television receiver 200 receives the response from the server, passes the information received from the server to the remote control 100 via the above-described short-range wireless communication, and carries out the reading and writing of the information from or to the IC card via the CPU 103 in the remote control 100. Then, similar procedures are repeated several times to complete the procedure for purchasing the content.

In a related-art procedure for purchasing the content, such as the movie content, as delivered via the Internet as described above, the user places the IC card close to a card read/write portion of a reader/writer provided in the television receiver or a reader/writer connected to the television receiver via USB (Universal Serial Bus) or the like, in order to read the information stored in the IC card, for example. Therefore, while the user is able to perform operations such as switching the channel of the television receiver at a distance from the television receiver by using the remote control, the user needs to approach the television receiver for the operation when a read from or a write to the IC card is necessary, such as when performing the procedure for purchasing the content, for example.

The remote control 100 according to the present embodiment contains the reader/writer 106 for reading and writing the information from or to the IC card. Therefore, just as the user is able to perform operations such as turning on or off the power of the television receiver 200 or selecting the channel by using the remote control 100, the user is able to achieve the process of reading and writing the information from or to the IC card using the reader/writer 106 by using the remote control 100 at hand, by placing the IC card over the card read/write portion 20 of the remote control 100. Thus, simpler and more comfortable user operation is accomplished.

In the remote control 100, the number keys 18a to 18l marked with the numbers "1" to "12" are arranged in an inner part of the printed wiring board surrounded by the loop antenna 19, i.e., at the same location as the card read/write portion 20 used for performing the process of reading and writing the information from or to the IC card. Therefore, if the user places the IC card over the card read/write portion 20 at the time of reading the information from the IC card such as at the time of the electronic settlement, the number keys 18a to 18l will be covered by the IC card. As described above, at the time of reading and writing the information from or to the IC card, the user primarily uses, out of the operation keys of the remote control 100, the directional key 14a used for selecting the content or the like, the Enter key 14b used for determining to purchase the selected content, and the like to perform a charging procedure, for example, Thus, at the time of reading and writing the information from or to the IC card, the user does not need to use the number keys 18a to 18l very often, which will be covered by the IC card placed over the card read/write portion 20. Therefore, the user will not feel uncomfortable when operating the remote control 100.

As described above, in the remote control 100 according to the present embodiment, the number keys 18a to 18l are arranged inside the loop antenna 19 of the reader/writer 106, but the user is able to operate, without inconvenience, the operation keys required at the time of reading and writing the information from or to the IC card. In other words, those operation keys (which include the directional key 14a, in the present embodiment) which are required when the reader/writer 106 reads and writes the information from or to the IC card are arranged at a location which is not covered by the IC card when the IC card is placed over the card read/write portion 20. Therefore, the user will not reduce the convenience of the remote control 100.

Meanwhile, the user may sometimes need to operate the number keys 18a to 18l, which are covered by the IC card when the IC card is placed over the card read/write portion 20, at the time of reading and writing the information from or to the IC card, for example, in the case where a price for purchasing the content, the number of items to be purchased, or the like is to be set. In that case, if the user moves the IC card away from the card read/write portion 20 and attempts to press any of the number keys 18a to 18l, the magnetic field generated from the loop antenna 19 will fail to extend to the IC card. As a result, the process by the reader/writer 106 of reading and writing the information from or to the IC card might come to be performed abnormally. This may lead to an unexpected trouble with the process of reading and writing the information from or to the IC card in which information of the electronic money or the like is stored, for example.

Thus, when the reader/writer 106 reads and writes the information from or to the IC card, the CPU 103 in the remote control 100 is capable of performing control to change the functions of the arranged operation keys so that the user will be able to perform any necessary operation at the time of reading and writing the information from or to the IC card, by using the operation keys whose functions have been changed.

Specifically, if the CPU 103 in the remote control 100 recognizes that the reader/writer 106 has been turned on at the time of reading and writing the information from or to the IC card, the CPU 103 automatically changes the functions of the "+" and "−" keys of the Up/Down channel key 15 and the "+" and "−" keys of the volume control key 16, and assigns functions of increasing and decreasing the price to the "+" and "−" keys of the Up/Down channel key 15 and functions of increasing and decreasing a purchase quantity to the "+" and "−" keys of the volume control key 16, for example. If the CPU 103 recognizes that the reader/writer 106 has been turned off, the CPU 103 cancels the change in the functions of those operation keys, and returns the functions of the operation keys to their regular functions. Thus, when the number keys 18a to 18l are covered by the IC card placed over the card read/write portion 20, the user is able to set the price or the purchase quantity, for example, by operating the operation keys whose functions have been changed and which are not covered by the IC card, without the need to operate the number keys 18a to 18l covered by the IC card.

As described above, in the remote control 100, it is possible to control the functions of the operation keys to be changed when the reader/writer 106 reads and writes the information from or to the IC card. Therefore, when the user is unable to operate some of the operation keys because they are covered by the IC card placed over the card read/write portion 20, it is possible to allow other operation keys to have the functions of those covered operation keys. Moreover, because this process of changing the functions of the operation keys is controlled by automatic determination of the CPU 103 in the remote control 100, the user does not need to perform a process of changing the functions of the operation keys using a mode key, or perform a cumbersome operation, such as pressing an operation key while at the same time holding down a Shift key, to change the function of the operation key. That is, the user operation is made easier.

The remote control 100 is capable of the bidirectional wireless communication with the television receiver 200. Therefore, in the case where the functions of the operation keys have been changed as described above, when the reader/writer 106 reads and writes the information from or to the IC card, the CPU 103 in the remote control 100 may transmit, to the television receiver 200, a command to display directions for the operation of the remote control 100 on the screen, for example. This will facilitate the user operation, allowing the user to perform an operation while referring to the directions, and eliminating the need to take the trouble to consult an instruction manual or the like in order to check the operation keys whose functions have been changed.

Further, at the time of reading and writing the information from or to the IC card, the remote control 100 may cause an LED to light up to indicate that the functions of the operation keys have been changed. In this case, because the change in the functions of the operation keys may occur at the same time when the reader/writer 106 is turned on or off, the CPU 103 in the remote control 100 may detect the turning on or off of the reader/writer 106 to turn on or off the LED. Notice that the fact that the LED is on can also indicate that the reader/writer 106 is in operation.

Still further, because the remote control 100 is capable of the bidirectional wireless communication with the television receiver 200 and is also capable of recognizing whether the reader/writer 106 is on or off, an indication that the functions of the operation keys have been changed may be displayed on the screen of the television receiver 200.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

For example, in the above-described embodiments, the remote control 100 uses the RFID to read and write the information from or to the contactless IC card. Note, however, that in another embodiment of the present application, the remote control may read or write information from or to a contact magnetic card. Also note that, as noted previously, examples of contactless information storage media are not limited to the IC card, but also include electronic devices, such as a cellular phone, that have a function of the contactless IC card.

Also note that, while the configuration of the components on the printed wiring board in the remote control 100 is illustrated in FIG. 6, the present application should not be limited to this configuration of the components.

The invention is claimed as follows:

1. A remote control apparatus for remotely operating an electronic device, the remote control apparatus comprising:
   operation means having a first plurality of operation keys; and
   a reader/writer configured to read and/or write information from or to an information storage medium, wherein
   in said operation means, a second plurality of operation keys of the first plurality of operation keys is arranged so as to overlap an area inside a loop antenna forming a read/write portion of said reader/writer for transmitting and receiving the signal to or from the information storage medium, the read/write portion being used for the reading and/or writing of the information from or to the information storage medium,
   wherein the information storage medium is a contactless information storage medium,
   wherein said reader/writer uses electromagnetic induction at 13.56 MHz in radio frequency identification to transmit and receive a signal to or from the information storage medium,
   wherein the loop antenna is arranged on a printed wiring board on which the first plurality of operation keys are arranged, and a part or a whole of the loop antenna extends along edges of the printed wiring board,
   further comprising:
   switch means for switching functions of the first plurality of operation keys at the time of the reading and/or writing of the information from or to the information storage medium.

2. The remote control apparatus according to claim 1, wherein at least one of the second plurality of operation keys in said operation means is covered by the information storage medium when said reader/writer reads and/or writes the information from or to the information storage medium.

3. The remote control apparatus according to claim 1, wherein, of the first plurality of operation keys in said operation means, an operation key that needs to be operated at the time of the reading and writing of the information from or to the information storage medium is arranged so as not to overlap the read/write portion of said reader/writer.

4. The remote control apparatus according to claim 2, wherein
   the reading and/or writing of the information from or to the information storage medium is capable from a front side of the remote control apparatus, where the second plurality of operation keys are arranged, while a magnetic field generated from said reader/writer extends to a rear side of the remote control apparatus, so that the reading and/or writing of the information from or to the information storage medium is also capable from the rear side of the remote control apparatus.

5. The remote control apparatus according to claim 1, wherein
   the loop antenna is arranged on a rears side of a printed wiring board whose front side has the second plurality of operation keys arranged thereon, so as to form the read/write portion, and
   the reading and/or writing of the information from or to the information storage medium is carried out from a rear side of the remote control apparatus, where the read/write portion is formed.

6. The remote control apparatus according to claim 5, wherein a power supply battery is arranged within the remote control apparatus so as not to overlap the printed wiring board.

7. The remote control apparatus according to claim 1, wherein the first plurality of operation keys are the same operation keys as the second plurality of operation keys.

* * * * *